United States Patent
Lee et al.

(10) Patent No.: US 7,316,065 B2
(45) Date of Patent: Jan. 8, 2008

(54) METHOD FOR FABRICATING A PLURALITY OF ELASTIC PROBES IN A ROW

(75) Inventors: Yi-Chang Lee, Tainan (TW); An-Hong Liu, Tainan (TW); Yeong-Her Wang, Tainan (TW); Yeong-Ching Chao, Tainan (TW); Hsiang-Ming Huang, Tainan (TW)

(73) Assignees: ChipMOS Technologies (Bermuda), Hamilton (BM); ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 11/364,330

(22) Filed: Mar. 1, 2006

(65) Prior Publication Data
US 2006/0267607 A1   Nov. 30, 2006

(30) Foreign Application Priority Data
May 25, 2005  (CN) .............................. 94 1 17087

(51) Int. Cl.
*G01R 3/00*    (2006.01)
(52) U.S. Cl. ............................ 29/884; 29/842; 29/846; 29/874; 324/761; 361/772

(58) Field of Classification Search ................. 29/825, 29/827, 829–846, 847, 848, 849, 874, 876, 29/881–885; 174/253, 254, 261, 267; 324/474, 324/761, 762; 361/772–776, 791
See application file for complete search history.

(56) References Cited

U.S. PATENT DOCUMENTS

| 6,229,100 | B1 * | 5/2001 | Fjelstad ........................ 174/261 |
| 6,274,822 | B1 * | 8/2001 | Light et al. .................. 174/260 |
| 6,807,734 | B2 * | 10/2004 | Eldridge et al. .............. 29/874 |

FOREIGN PATENT DOCUMENTS

CN        TW517320        1/2003

* cited by examiner

*Primary Examiner*—Peter Vo
*Assistant Examiner*—Livius R. Cazan
(74) *Attorney, Agent, or Firm*—Troxell Law Office, PLLC

(57) ABSTRACT

A method of forming a plurality of elastic probes in a row is disclosed. Firstly, a substrate is provided, then, a shaping layer is formed on the substrate so as to offer two flat surfaces in parallel. A photoresist layer is formed on the substrate and on the shaping layer. Then, the photoresist layer is patterned to form a plurality of slots crossing an interface between the two flat surfaces where a plurality of elastic probes are formed in the slots. In one embodiment, the interface is an edge slope of the shaping layer so that each of the elastic probes has at least an elastic bending portion. During chip probing, the shifting direction of the elastic probes due to overdrives is perpendicular to the arranging direction of the bonding pads so that the elastic probes are suitable for probing chips with high-density and fine-pitch bonding pads.

5 Claims, 11 Drawing Sheets

METHOD FOR FABRICATING A PLURALITY OF ELASTIC PROBES IN A ROW

FIELD OF THE INVENTION

The present invention relates to a method of fabricating a plurality of elastic probes in a row, and more particularly, to a method of fabricating a plurality of elastic probes in a row which can scrub through the oxide layer on the high-density, fine-pitch bonding pads of a semiconductor chip under testing.

BACKGROUND OF THE INVENTION

In a conventional IC tester, a probe card with probes is installed in the test head of a tester. A flexible portion have been specially designed in the probes of a probe card which can scrub through the oxide layer on the bonding pads of an IC chip under test to ensure good electrical contacts. Conventional methods of manufacturing the probes include metal casting, extraction, or pressing, however, a tailor-made tooling is required which is very expensive where the shapes of the probes are very limited. Moreover, as the pitches of the bonding pads become smaller and the densities of the bonding pads become higher, probes manufactured by conventional methods cannot meet the fine-pitch and high-density requirement of the bonding pads.

As revealed in R.O.C. Taiwan Patent publication No. 517320, John et al. discloses a method of manufacturing a plurality of flexible probes in a row using vapor deposition. As shown in FIG. 1, a substrate 10 is provided which has a flat surface 11 where a plurality of probes 20 are formed on the flat surface 11 by sputtering, plating, or chemical-vapor deposition. A connecting bar 21 is connected to the probes 20. Each probe 20 has a contact point 22 and a flexible portion 23 bent in the horizontal direction along the flat surface 11 of the substrate 10. The probes 20 are assembled to a probe card.

As shown in FIG. 2, an IC 30 under test has a plurality of bonding pads 31. During chip probing, the contact points 22 of the probes 20 will contact the bonding pads 31 of the IC 30. While the contact points 22 of the probes 20 are probing the bonding pads 31, the flexible portion 23 of the probes 22 due to the overdrives will allow the contact points 22 to shift in the same horizontal direction 32 to penetrate the oxide layer on the bonding pads 31. However, the penetrating shift direction 32 is parallel to the arranging direction of the bonding pads 31 which cause electrical shorts between the probes 22 and damages to the IC, the probe card or even the tester.

SUMMARY OF THE INVENTION

The main purpose of the present invention is to provide a method for fabricating a plurality of elastic probes in a row where a shaping layer is formed on a flat surface of a substrate to offer another flat surface and a photoresist layer is formed on the shaping layer. The photoresist layer is patterned to form a plurality of slots crossing the interface of the two flat surfaces which partially expose the substrate and the shaping layer for forming the plurality of elastic probes. Therefore, the elastic bending portions of the probes are not parallel to the flat surfaces of the substrate nor the shaping layer where the probes are formed. During chip probing, when the contact points of the probes contact the bonding pads of the chip, the probes due to overdrives will be bent. The penetrating shift direction of the contact points is approximately perpendicular to the arranging direction of the bonding pads which is suitable for probing chips with fine-pitch and high-density bonding pads. Moreover, the probes will not short to each other during chip probing and the probes can easily installed on the probe head to shorten the lead time of manufacturing a probe card.

The second purpose of the present invention is to provide a method for fabricating a plurality of elastic probes in a row where the shaping layer is disposed and patterned on the substrate where an edge slope of the shaping layer is formed as an interface between the two flat surfaces of the substrate and the shaping layer. Accordingly, each of the probes has two end portions on the substrate and/or on the shaping layer and at least a flexible portion therebetween, wherein the flexible portion is formed on the edge slope not parallel to the two end portions. The contacting points and the connecting points of the probes are formed in the two end portions. The edge slope of the shaping layer will determine the shapes of the flexible portions to save the expensive tooling cost of fabricating different shapes of probes.

The third purpose of the present invention is to provide a method for fabricating a plurality of elastic probes in a row where the shaping layer has an edge slope as an interface between the flat surfaces of the substrate and the shaping layer. A photoresist layer is formed on the flat surfaces of the substrate and the shaping layer. The photoresist layer is then patterned to form a plurality of slots crossing the edge slope to partially expose the flat surfaces of the substrate and the shaping layer for forming a plurality of elastic probes in a row. Therefore, the elastic bending portions of the probes are not parallel to the flat surfaces of the substrate nor the shaping layer. During chip probing, the penetrating shift direction of the contact points of the probes due to overdrives are approximately perpendicular to the arranging direction of the bonding pads on the IC chip without causing shorts between the elastic probes which are capable of probing a chip with fine-pitch and high-density bonding pads. Moreover, the probes are installed or replaced on a probe head row by row to shorten the lead time of manufacturing a probe card.

The fourth purpose of the present invention is to provide a method for fabricating a plurality of elastic probes in a row where a substrate is provided. A recess is formed in the substrate to have a bottom and a plurality of inner sides to form the elastic bending portions of the elastic probes. The elastic probes have contact portions, connecting portions formed on the flat surface of the substrate and middle portions formed on the bottom. The elastic bending portions are formed on the inner sides of the recess. The shapes of the elastic bending portions are determined by the recess to save the tooling cost for fabricating different shapes of probes.

The fifth purpose of the present invention is to provide a probe pin assembly having a plurality of elastic probes in a row where each of the elastic probes has a first end portion, at least an elastic bending portion, and a second end portion. The first end portions and the second end portions are connected by the corresponding elastic bending portions. All of the first end portions and all of the second end portions are formed on two flat planes which are parallel or coplanar. Moreover, the elastic bending portions are not parallel to the two flat planes. Therefore, when probing high-density and fine-pitch bonding pads of a chip, probes will swift without cause shorts between the probes.

According to the present invention, a method for fabricating a plurality of elastic probes in a row is revealed where each of the elastic probes has a first end portion, a second end portion, and at least an elastic bending portion connecting the first end portion and the second end portion. A substrate is provided, and a shaping layer is formed on a first flat surface of the substrate to offer a second flat surface, where an interface is formed between the exposed first flat surface and the second flat surface. Then, a photoresist layer is formed on the shaping layer and on the substrate. Then, the photoresist layer is patterned to form a plurality of slots crossing the interface to partially expose the substrate and the shaping layer for forming the elastic probes. Finally, a probe metal layer is formed in the slots so that the first end portions of the elastic probes are formed on the first flat surface of the substrate, the second end portions on the second flat surface of the shaping layer, and the elastic bending portions are formed on the interface.

DETAIL DESCRIPTION OF THE INVENTION

Please refer to the attached drawings, the present invention will be described by means of embodiment(s) below.

Figure 1:
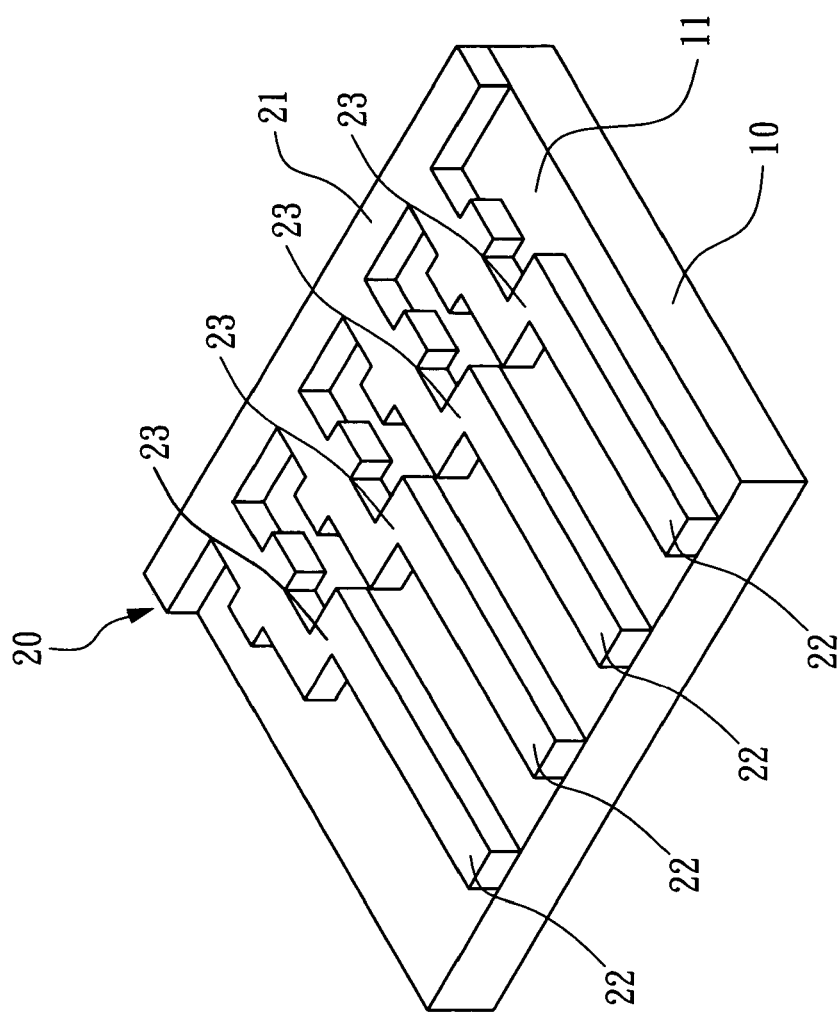
FIG. 1 is a three-dimensional view of a conventional probe pin assembly having elastic probes fabricated on a substrate.
Figure 2:
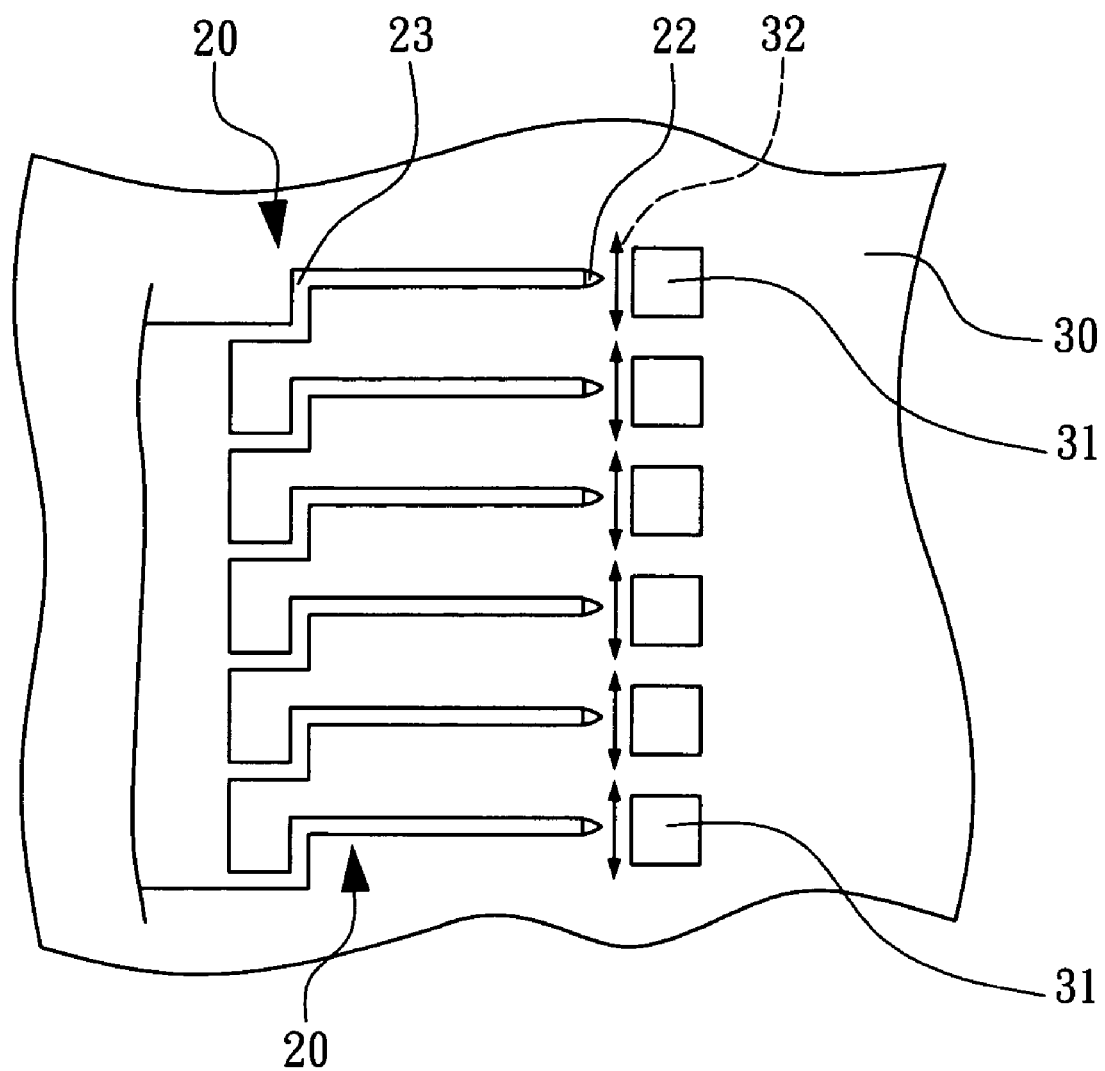
FIG. 2 shows the penetrating shift direction of the elastic probes when probing an untested IC chip.
Figure 3A:
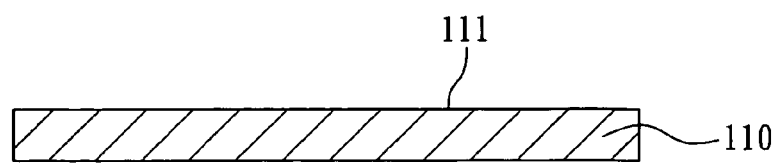
FIGS. 3A to 3G are the cross sectional views of a substrate during fabrication processes of a probe pin assembly having elastic probes according to the first embodiment of the present invention.
Figure 3B:
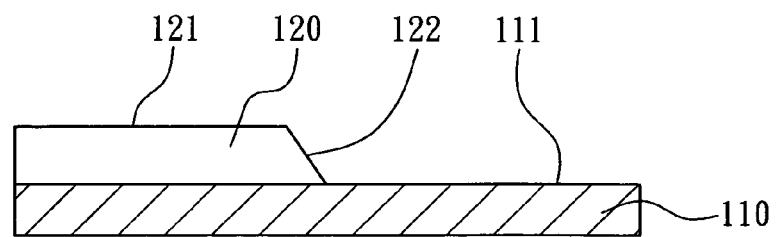
Figure 3C:
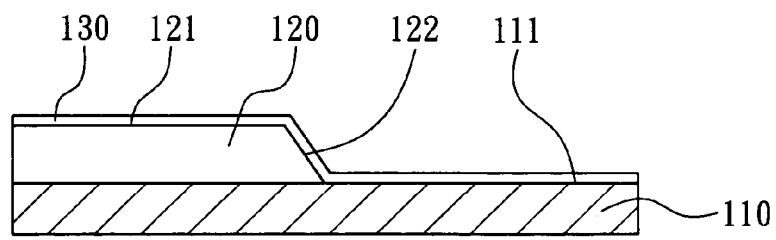

In the first embodiment according to present invention, a method for fabricating a plurality of elastic probes in a row is disclosed as shown in FIG. 3A to 3G. Firstly, as shown in FIG. 3A, a substrate 110 is provided, where the substrate 110 is a semiconductor substrate having a first flat surface 111. As shown in FIG. 3B, a shaping layer 120 is formed on the first flat surface 111 of the substrate 110, where at least a portion of the first flat surface 111 is still exposed. The material of the shaping layer 120 may selected from photoresist or the other material easy to pattern. The shaping layer 120 has a second flat surface 121 higher than and parallel to the first flat surface 111. In this embodiment, the shaping layer 120 further has an edge slope 122 as an interface between the first flat surface 111 and the second flat surface 121. Therein, the included angle between the first flat surface 111 of the substrate 110 and the edge slope 122 ranges from 20 to 80 degrees and the thickness of the shaping layer 120 ranges from 2 to 100 micrometers. As shown in FIG. 3C, preferably, a release layer 130 is formed on the first flat surface 111 of the substrate 110 and on the second flat surface 121 and the edge slope 122 of the shaping layer 120. In this embodiment, the release layer 130 contains titanium formed by metal sputtering.

Figure 3D:
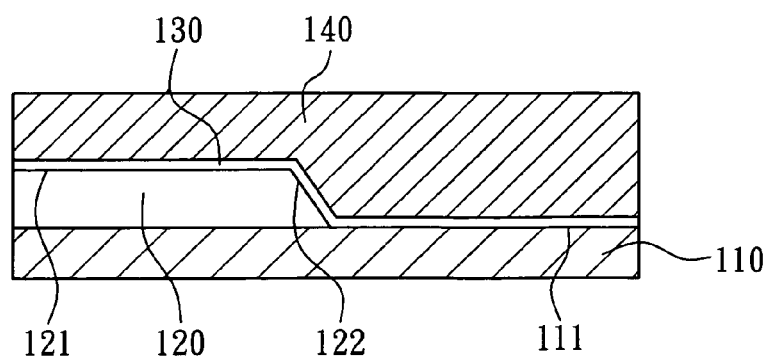
Figure 3E:
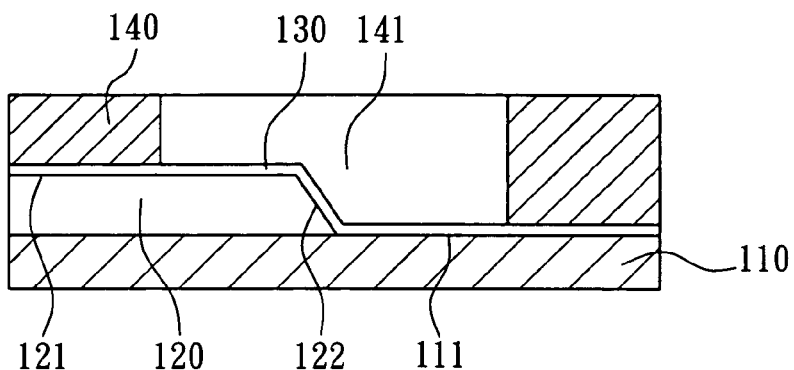

As shown in FIG. 3D, a photoresist layer 140 is formed on the release layer 130 above the first flat surface 111, the second flat surface 121 and the edge slope 122. The thickness of the photoresist layer 140 may be thicker than the shaping layer 120. As shown in FIG. 3E, the photoresist layer 140 is patterned to form a plurality of slots 141 by photolithography. The slots 141 are configured for forming the plurality of elastic probes, wherein the slots 141 cross the edge slope 122 from the first flat surface 111 to the second flat surface 121.

Figure 3F:
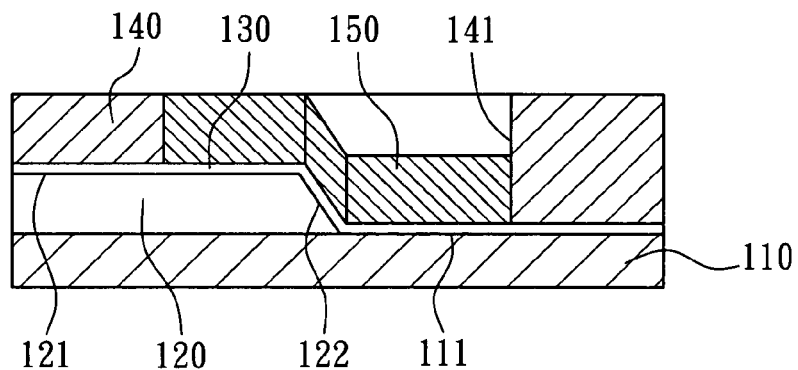

As shown in FIG. 3F, a probe metal layer 150 is formed in the slot 141 by electroplating or electroless-plating. Please refer to FIGS. 3G and 4, the probe metal layer 150 includes a plurality of elastic probes 160. The thickness of the probe metal layer 150 can be increased to enhance the mechanical strength of the probes. Preferably, the probe metal layer 151 is a multi-layer structure by plating, which includes at least an elastic support layer, a conductive layer, and an anti-adhesive metal layer (not shown in the figures). For example, the elastic support layer can be made of nickel or nickel-cobalt, the conductivity metal is made of gold and formed on the elastic support layer for high speed and high frequency testing, the anti-adhesive metal layer is made of palladium and formed on the conductivity metal.

Figure 3G:
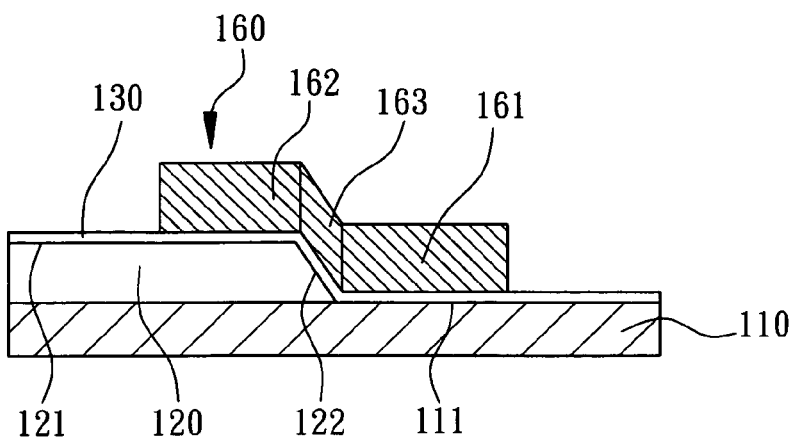

As shown in FIG. 3G, the photoresist layer 140 is stripped and the release layer 150 is also etched so that the elastic probes 160 can separate from the substrate 110 and the shaping layer 120. Each of the elastic probes 160 has a first end portion 161, a second end portion 162, and at least an elastic bending portion 163 connecting the first end portion 161 and the second end portion 162.

Figure 4:
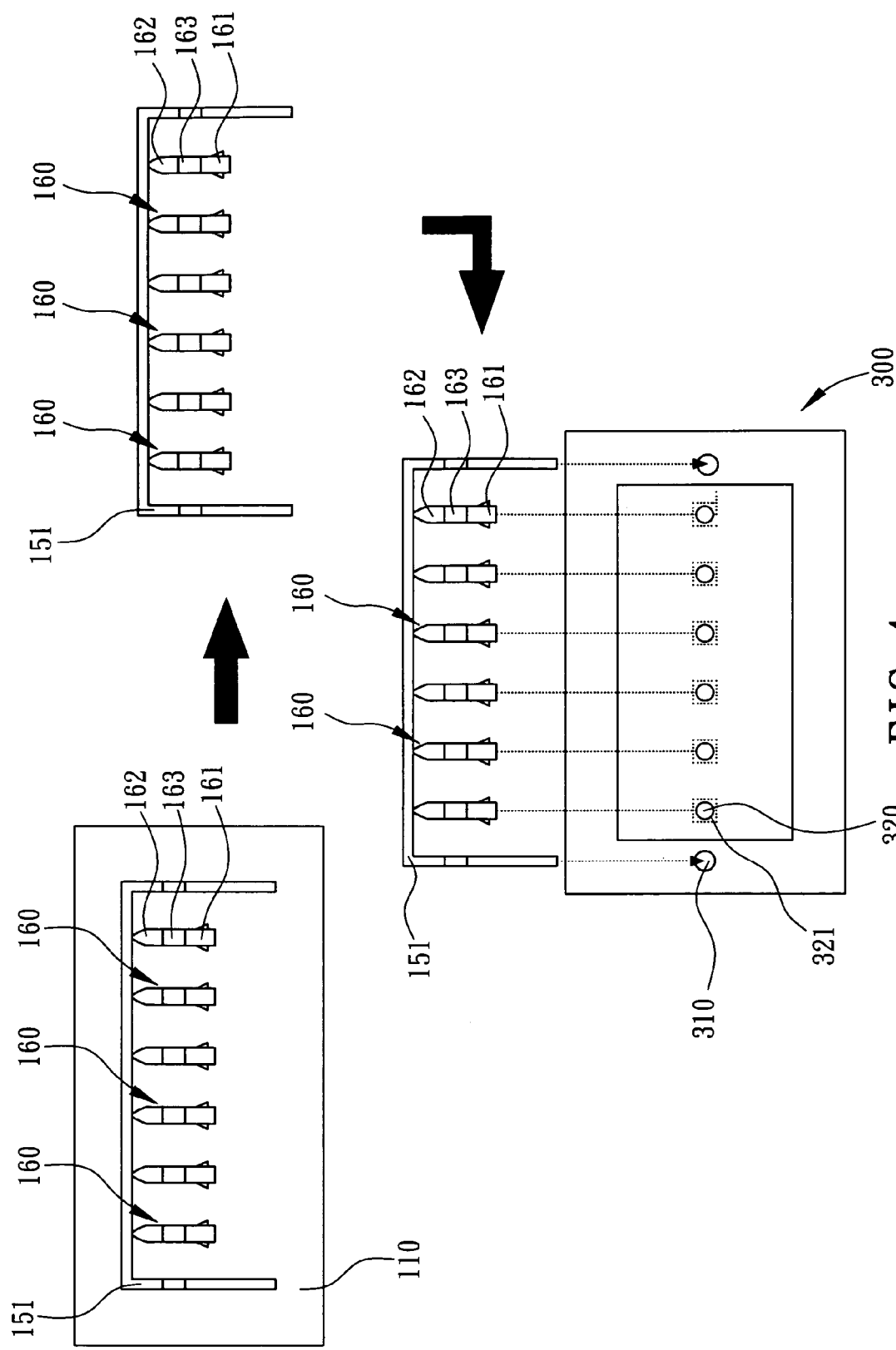
FIG. 4 shows the probe pin assembly when connecting to a probe head according to the first embodiment of the present invention.

As shown in FIGS. 3F, 3G, and 4, at least a portion of the probe metal layer 150 lying on the first flat surface 111 of the substrate 110 includes the first end portions 161 of the elastic probes 160. At least a portion of the probe metal layer 150 lying on the second flat surface 121 of the shaping layer 120 includes the second end portions 162 of the elastic probes 160. At least a portion of the probe metal layer 150 lying on the edge slope 122 includes the elastic bending portions 163 of the elastic probes 160. Accordingly, all of the first end portions 161 and all of the second end portions 162 are formed on two different planes in parallel. In this embodiment, the first end portions 161 of the elastic probe 160 are used as connecting ends and the second end portions 162 of the elastic probe 160 are used as contacting ends. Preferably, the slots 141 are connected together such that the probe metal layer 150 further comprises a connecting bar 151 integrally connecting to the elastic probes 160 (as shown in FIG. 4). In this embodiment, the connecting bar 151 is connected to the contacting ends (one ends of the second end portion 162).

Figure 5:
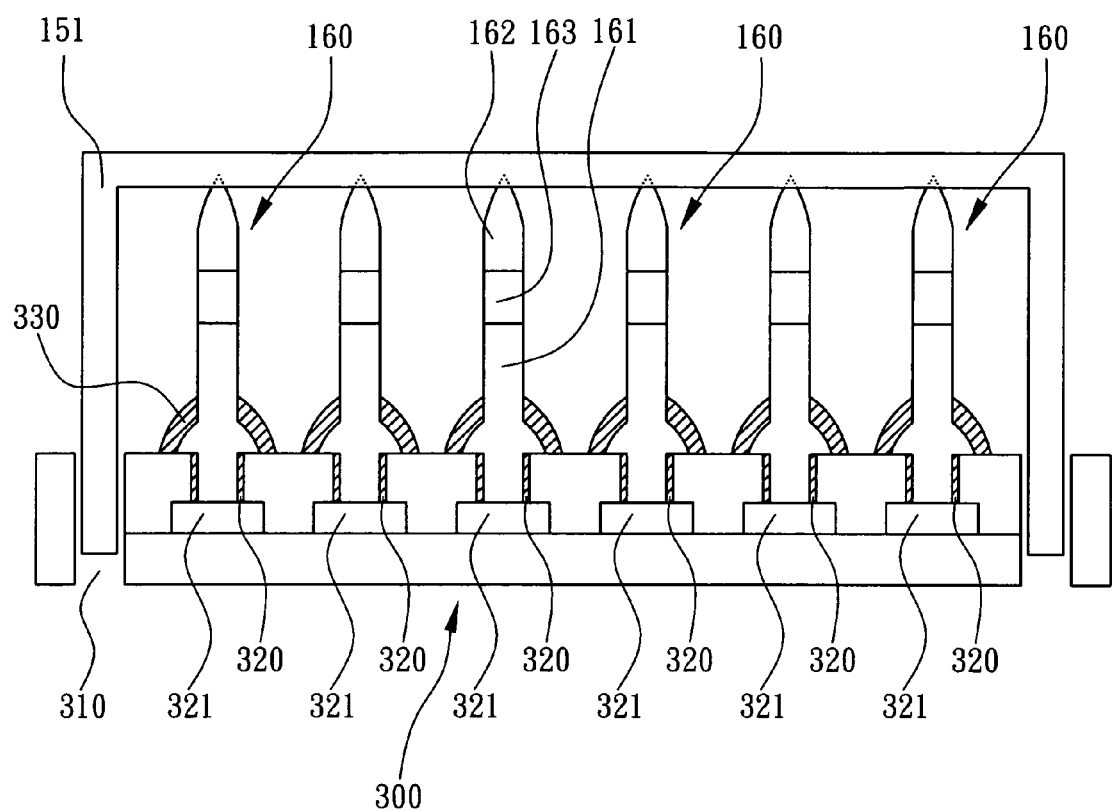
FIG. 5 is the cross sectional view of the probe pin assembly placed on the probe head according to the first embodiment of the present invention.

As shown in FIGS. 4 and 5, a probe head 300 has a plurality of alignment holes 310, a plurality of connecting holes 320, and a plurality of probe pads 321. Both ends of the connecting bar 151 are inserted into the alignment holes 310 of the probe head 300. Thereby, the first end portions 161 of the elastic probes 160 are aligned with the probe pads 321 in the connecting holes 320 of the probe head 300. Solder 330 electrically connect the elastic probes 160 and the probe pads 321. Then, the connecting bar 151 is separated from the probe contacting ends (one ends of the second end portions 162) of the elastic probes 160 by metal etching or by mechanical breaking for probing IC.

Figure 6:
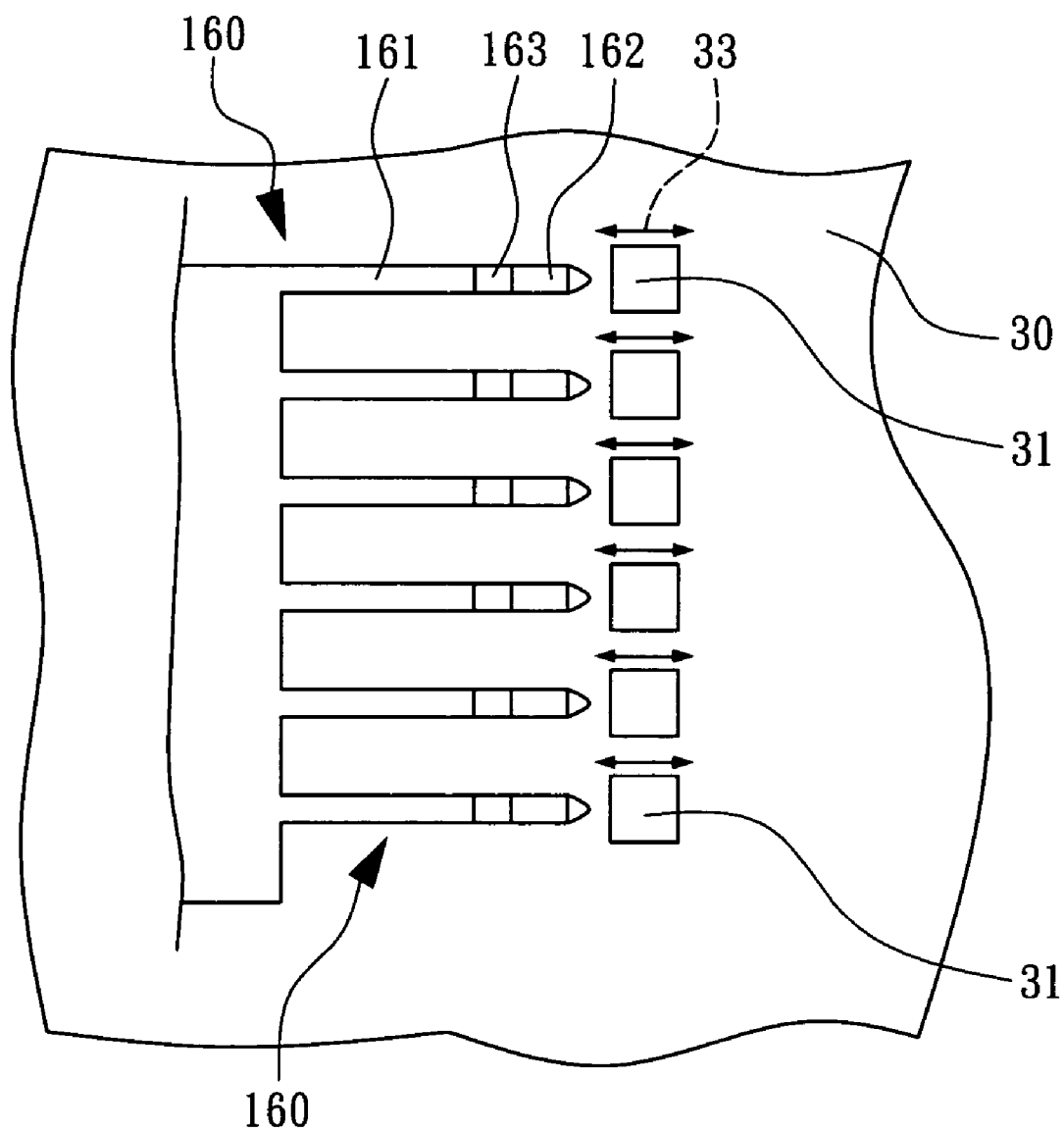
FIG. 6 shows the penetrating shift direction of the elastic probes when probing an untested IC chip according to the first embodiment of the present invention.

As shown in FIG. 6, during chip probing, an IC 30 under test has a plurality of bonding pads 31 (or testing pads). The second end portions 162 of the elastic probes 160 have contacting ends to probe the bonding pads 31 of the IC 30. The penetrating shifting direction 33 of the elastic probes 160 due to overdrives will be approximately perpendicular to the arranging direction of the bonding pads 31 of the IC 30 (the arranging direction of the elastic probes 160) so that the bonding pads 31 will be short together. It is suitable for probing IC chips with fine-pitch and high-density bonding pads.

Figure 7A:
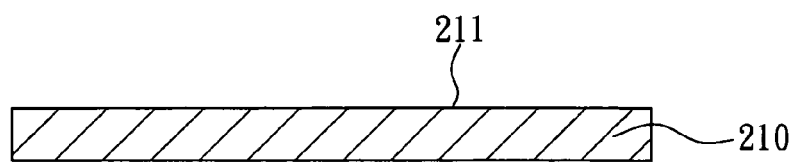
FIGS. 7A to 7G are the cross sectional views of a substrate during fabrication processes of a probe pin assembly having elastic probes according to the second embodiment of the present invention.
Figure 7B:
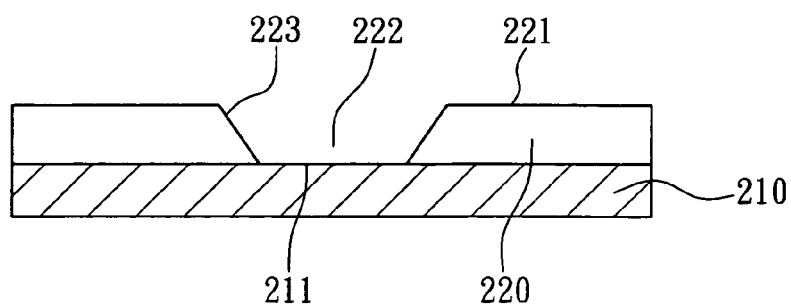
Figure 7C:
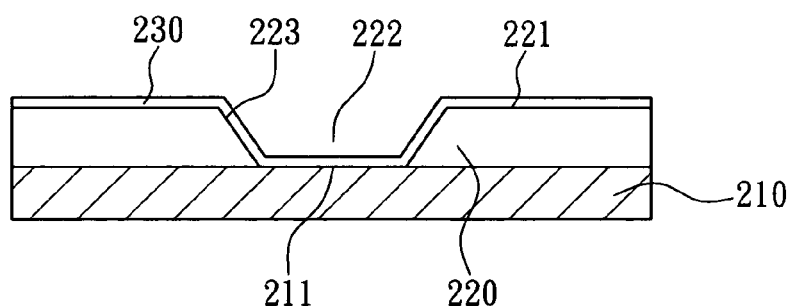

In the second embodiment of the present inventions, another method for fabricating a plurality of elastic probes in a row is shown from FIGS. 7A to 7G. As shown in FIG. 7A, firstly, a substrate 210 is provided, which has a first flat surface 211. As shown in FIG. 7B, a shaping layer 220 is formed on the first flat surface 211 of the substrate 210 where the shaping layer 220 has a second flat surface 221 and a recess 222 to expose at least a portion of the first flat surface 211. In this embodiment, the depth of the recess 222 ranges from 2 to 100 micrometers. The photoresist layer 220 further has a plurality of edge slopes 223 in the recess 222 between the exposed first flat surface 211 and the second flat surface 221. Therein, the included angle between the edge slopes 223 and the covered first flat surface 211 of the substrate 210 ranges from 20 to 80 degrees. As shown in FIG. 7C, preferably, a release layer 230 is formed on the first flat surface 211 of the substrate 210, the second flat surface 221, and the edge slopes 223 of the shaping layer 220 by means of metal sputtering. In this embodiment, the release layer 230 contains titanium and also can be used as a plating seed layer.

Figure 7D:
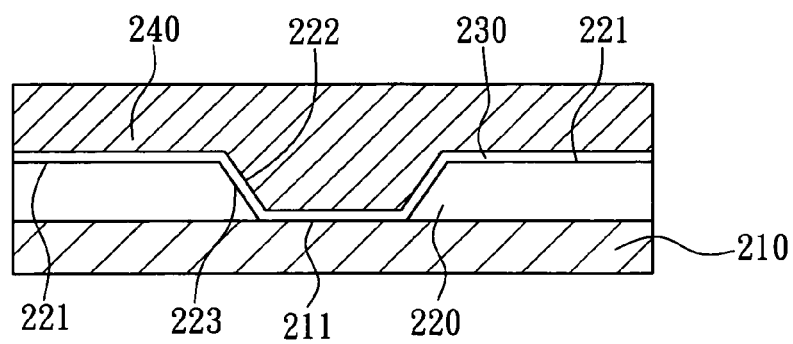
Figure 7E:
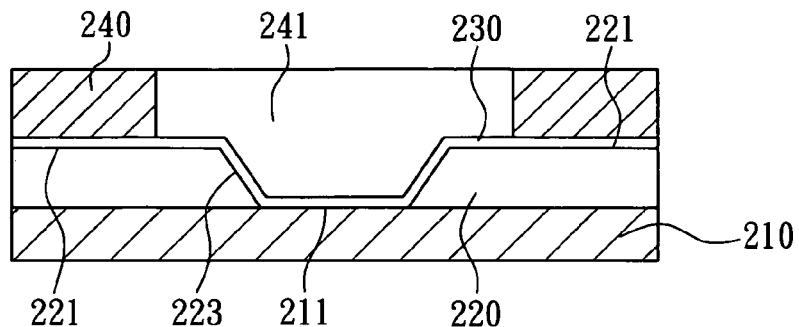

As shown in FIG. 7D, a photoresist layer 240 is formed on the release layer 230 and located above the first flat surface 211, the second flat surface 221, and the edge slopes 223. The thickness of the photoresist layer 240 is thicker than the shaping layer 220. As shown in FIG. 7E, the photoresist layer 240 is patterned to form a plurality of slots 241 by photolithography where the slots 241 cross the edge slopes 223.

Figure 7F:
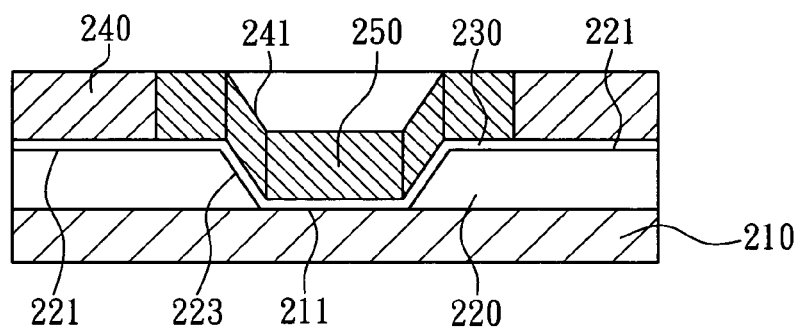
Figure 7G:
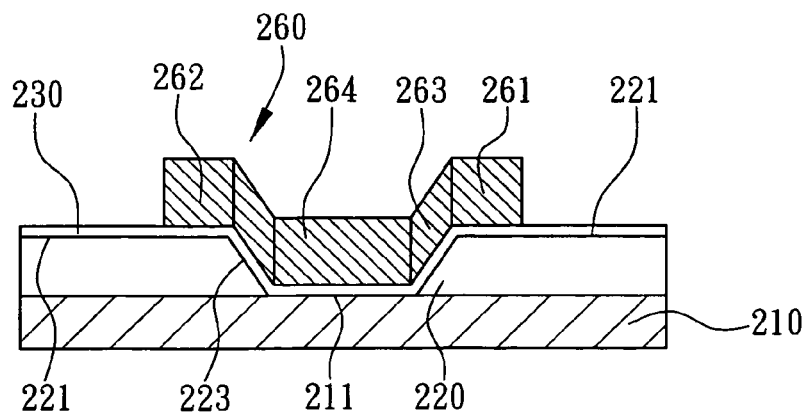

As shown in FIG. 7F, a probe metal layer 250 is disposed in the slots 241 to form a plurality of elastic probes 260 in a row where the probe metal layer 250 is chosen from a group of conductive metals such as nickel, cobalt, tungsten, gold, palladium, copper, iron, alloy 42 or copper alloy. As shown in FIG. 7G, the photoresist layer 240 is stripped so that the plurality of elastic probes 260 can easily separate from the substrate 210 and the shaping layer 220. Each of the elastic probes 260 has a first end portion 261, a second end portion 262, a plurality of elastic bending portions 263, and a middle portion 264. Referring to FIGS. 7F and 7G, at least a portion of the probe metal layer 250 on the second flat surface 221 of the shaping layer 220 includes the first end portions 261 and the second end portions 262 of the elastic probes 260 where each first end portion 261 has a connecting end and each second end portion 262 has a contact end. At least a portion of the probe metal layer 250 on the edge slopes 223 includes the plurality of elastic bending portions 263 of the elastic probes 260. At least a portion of the probe metal layer 250 on the first flat surface 211 of the substrate 210 includes the middle portions 264 of the elastic probes 260 formed in the recess 222. By means of the elastic bending portion 263 and the middle portion 264 of the elastic probes 260, the penetrating shift directions of the contact ends (one ends of the second end portions 262) are different from row-arranging direction of the elastic probes 260, almost perpendicular. The elastic probes 260 will not short together during probing an untested IC chip.

Figure 8A:
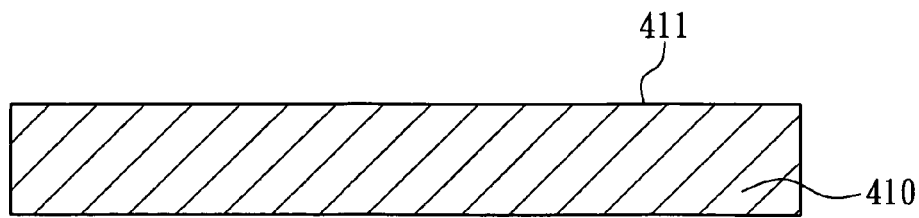
FIGS. 8A to 8G are the cross sectional views of a substrate during fabrication processes of a probe pin assembly having elastic probes according to the third embodiment of the present invention.
Figure 8B:
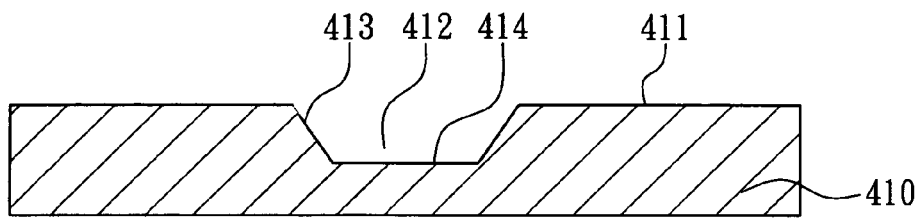
Figure 8C:
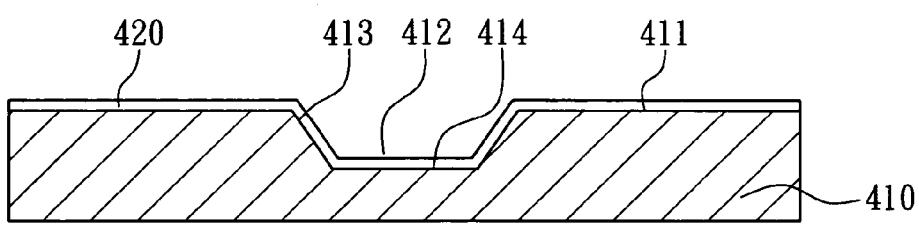

In the third embodiment of the present invention, another method for fabricating a plurality of elastic probes in a row is shown from FIGS. 8A to 8G. As shown in FIG. 8A, firstly, a substrate 410 is provided which has a flat surface 411. As shown in FIG. 8B, a recess 412 is created to form in the flat surface 411 of the substrate 410 by etching. The recess 412 has two edge slopes 413 and a bottom 414. In the present embodiment, the included angle between the edge slopes 413 and the bottom 414 ranges from 100 to 170 degrees and the depth of the recess 412 ranges from 2 to 100 micrometers. As shown in FIG. 8C, a release layer 420 is formed on the flat surface 411 and on the edge slopes 413 and the bottom 414 of the recess 412. In the present embodiment, the release layer 420 contains metal titanium to form elastic probes in a row.

Figure 8D:
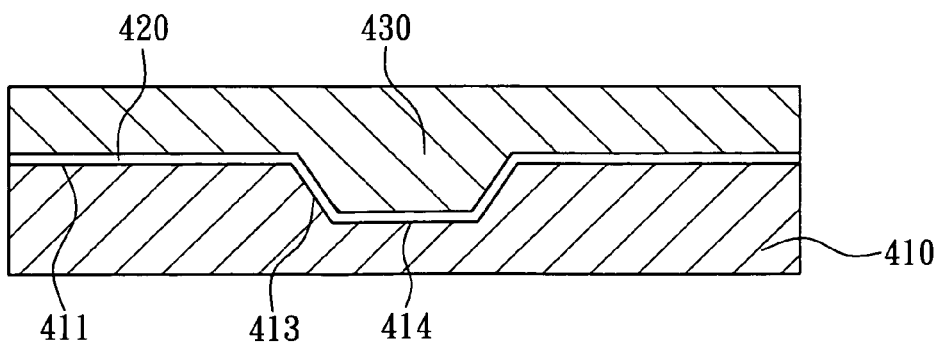
Figure 8E:
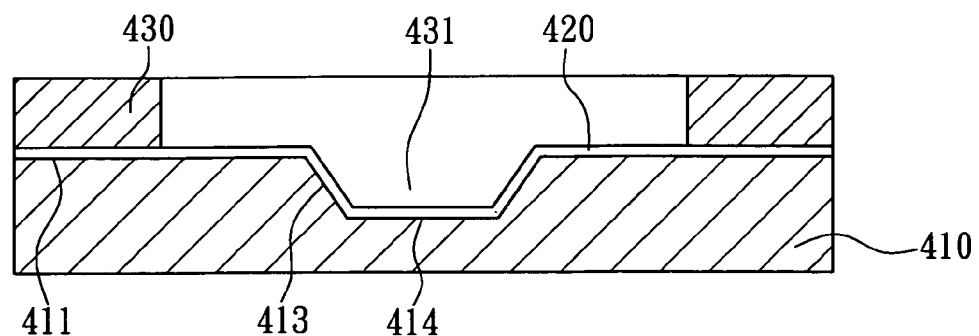

As shown in FIG. 8D, a photoresist layer 430 is formed on the release layer 420 by spin coating to locate above the flat surface 411 and in the recess 412. As shown in FIG. 8E, the photoresist layer 430 is patterned by photolithography to form a plurality of slots 431 where the slots 431 extend across the recess 412 of the substrate 410 for forming a plurality of elastic probes 450 in the slots 431.

Figure 8F:
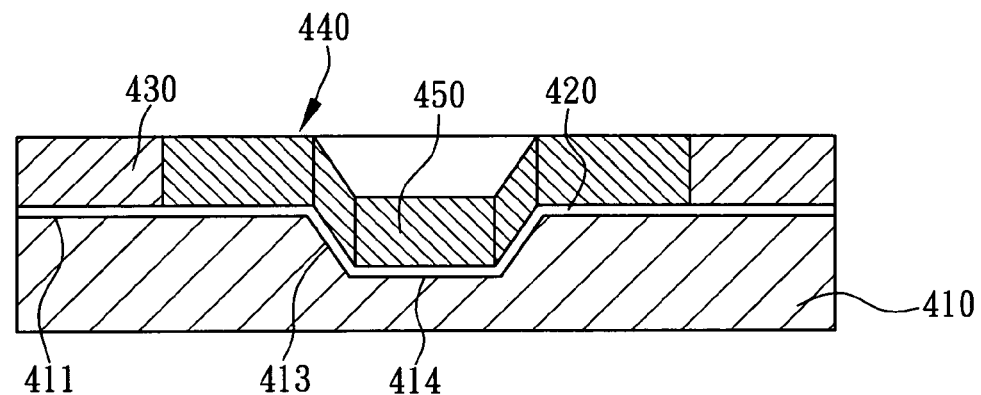
Figure 8G:
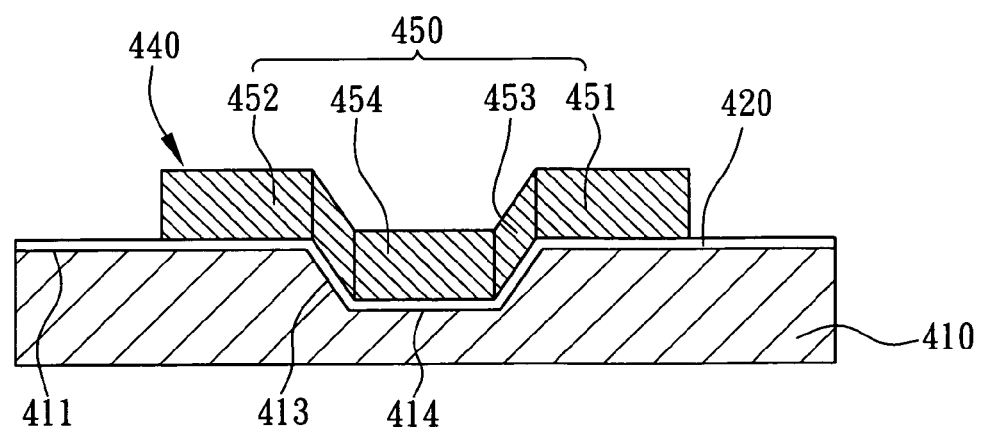

As shown in FIGS. 8F and 8G, a probe metal layer 440 is formed in the slots 431 to form a plurality of elastic probes 450 in a row. As shown in FIG. 8G, the patterned photoresist layer 430 is stripped so that the elastic probes 450 can separate from the substrate 410. Each of the elastic probes 450 has a first end portion 451, a plurality of elastic bending portions 453, a middle portion 454, and a second end portion 452.

As shown in FIGS. 8F and 8G, at least a portion of the probe metal layer 440 lying on the flat surface 411 of the substrate 410 includes the first end portions 451 and the second end portions 452 of the elastic probes 450. At least a portion of the probe metal layer 440 lying on the bottom 414 of the recess 412 includes the middle portions 454 of the elastic probes 450. Moreover, at least a portion of the probe metal layer 440 lying on the edge slopes 413 of the recess 412 includes the elastic bending portions 453 of the elastic probes 450. In this embodiment, the first end portions 451 have a plurality of connecting ends of the elastic probes 450 for bonding to a probe head and the second end portion 452 have a plurality of contact ends of the elastic probes 450 for chip probing. Therefore, the penetrating shift directions of the elastic probes 450 are parallel each other but different from the row-arranging direction of the elastic probes 450. When probing an untested IC chip, the second end portions 452 of the elastic probes 450 can probe the bonding pads of the IC chip and the shift direction due to overdrives is approximately perpendicular to the arranging direction of the bonding pads so that the probes will not be short to each other and will not damage the bonding pads.

The above description of embodiments of this invention is intended to be illustrative and not limiting. Other embodiments of this invention will be obvious to those skilled in the art in view of the above disclosure.

What is claimed is:

1. A method for fabricating a plurality of elastic probes in a row, wherein each of the elastic probes has a first end portion, a plurality of elastic bending portions, a middle portion, and a second end portion, the method comprising the steps of:

providing a substrate having a flat surface;
creating a recess in the flat surface of the substrate, the recess having a bottom and a plurality of inner sides;
forming a photoresist layer on the flat surface of the substrate and in the recess;
patterning the photoresist layer to form a plurality of slots crossing the recess, wherein the slots are connected;
forming a probe metal layer in the slots of the photoresist layer, wherein at least a part of the probe metal layer lying on the flat surface of the substrate includes the first end portions and the second end portions of the elastic probes, at least a part of the probe metal layer lying on the bottom of the recess includes the middle portions of the elastic probes, at least a part of the probe metal layer lying on the inner sides of the recess includes the elastic bending portions of the elastic probes, wherein the probe metal layer further comprising a connecting bar integrally connecting to the second end portions of the elastic probes;
removing the photoresist layer and the substrate;
mounting the first end portions of the elastic probes in a plurality of connecting holes of a probe head; and
removing the connecting bar after mounting the elastic probes.

2. The method of claim 1, wherein the inner sides of the recess are slopes.

3. The method of claim 2, wherein the included angle between the inner sides and the bottom surface of the recess ranges from 100 to 170 degrees, and the depth of the recess ranges from 2 to 100 micrometers.

4. The method of claim 1, further comprising the step of forming a release layer on the exposed flat surface of the substrate and on the inner sides and the bottom of the recess prior to forming the photoresist layer.

5. The method of claim 1, wherein the probe head further has a plurality of alignment holes for inserting two ends of the connecting bar.

* * * * *